United States Patent [19]

Matsumura et al.

[11] Patent Number: 4,856,641

[45] Date of Patent: Aug. 15, 1989

[54] APPARATUS AND A METHOD FOR CARRYING WAFERS

[75] Inventors: Yoshio Matsumura, Shiga; Hiroshi Matsui, Kyoto, both of Japan

[73] Assignee: Dainippon Screen Mfg. Co., Ltd., Japan

[21] Appl. No.: 120,987

[22] Filed: Nov. 16, 1987

[30] Foreign Application Priority Data

Nov. 25, 1986 [JP] Japan .................. 61-280043

[51] Int. Cl.$^4$ .............................. B65G 47/00
[52] U.S. Cl. .................. 198/346.2; 29/759; 432/6; 414/417
[58] Field of Search ............. 198/345, 346, 346.2, 198/346.3, 463.3, 468.6, 468.8, 775; 414/749, 96, 403, 416, 417; 29/759 X; 432/6 X, 259, 241

[56] References Cited

U.S. PATENT DOCUMENTS

| | | | |
|---|---|---|---|
| 3,973,665 | 8/1976 | Giammanco | 198/775 |
| 4,336,438 | 6/1982 | Uehara et al. | 198/346.2 |
| 4,518,078 | 5/1985 | Garrett | 198/775 |
| 4,534,695 | 8/1985 | Stump et al. | 198/775 X |
| 4,591,044 | 5/1986 | Osami et al. | 198/346.3 |
| 4,705,951 | 11/1987 | Layman et al. | 414/217 X |
| 4,721,198 | 1/1988 | Yajima et al. | 198/346.2 X |

FOREIGN PATENT DOCUMENTS

44721 3/1983 Japan .

OTHER PUBLICATIONS

Mori, Published 5/1986, United States Statutory Invention Registration, Reg. #H67.

Primary Examiner—Robert J. Spar
Assistant Examiner—James R. Bidwell
Attorney, Agent, or Firm—Ostrolenk, Faber, Gerb & Soffen

[57] ABSTRACT

A wafer carrying apparatus comprises a heat treatment plate for heat treating a wafer, the treatment plate having a plurality of through-holes spaced apart from each other at a prescribed distance. A plurality of pins are disposed to protrude from and to be retractable below the main surface of the heat treatment plate, through the through-holes. The tips of pins are kept at the same height and a pair of spaced elongated members, for example wires, whose relative spacing and position are changeable are effective for carrying and placing the wafer onto and removing the wafer from atop the pins.

19 Claims, 3 Drawing Sheets

APPARATUS AND A METHOD FOR CARRYING WAFERS

BACKGROUND OF THE INVENTION

1. Field of the Invention

The present invention relates to a carrying apparatus for carrying a semiconductor wafer or other thin sheet materials (hereinafter referred to as wafers) and, more specifically, it relates to an apparatus for carrying a wafer into and out of a heat treatment unit.

2. Description of the Prior Art

Examples of a wafer carrying apparatus of interest related to the present invention are disclosed in, for example, Japanese Patent Laying-Open Gazette No. 44721/1983 and in U.S. Pat. No. 4,591,044. The above mentioned U.S. Pat. No. 4,591,044, entitled "Apparatus for feeding wafers and the like" was issued to the assignee of the present invention on May 27, 1986. The referenced U.S. patent is incorporated herein by reference.

FIGS. 1A and 1B show an example of a conventional wafer transferring and carrying apparatus as in the referenced U.S. patent. FIG. 1A is a plan view of the apparatus and FIG. 1B is a cross sectional view taken along the line B—B in FIG. 1A.

The apparatus for feeding wafers comprises a carrying belt 3 for carrying a wafer 1, the belt 3 fitting in a trench 5 formed on the surface of a heat treatment plate 2, a pulley 9 for supporting the carrying belt 3, a push up pin 7 for easy detaching of wafer 1 from the heat treatment plate 2 after the heat treatment thereof and an air cylinder 8 for moving the push up pin 7 up and down. The heat treatment plate 2 has two types of through-holes, namely, a hole 4 having its end connected to a gas compressor and a hole 6 for moving the push up pin 7 up and down, in order to detach the wafer 1 easily from the heat treatment plate 2 after the heat treatment.

The wafer 1 is carried onto the heat treatment plate 2 by the carrying belt 3. At the time of carrying-in, the pulley 9 is raised so that the lower surface of the carrying belt 3 is apart from the surface of the heat treatment plate 2 and the carrying belt 3 moves freely.

When the wafer is carried onto a prescribed position on the heat treatment plate 2, the pulley 9 is lowered to the heat treatment plate. Consequently, the carrying belt 3 is lowered into the trench 5 that is formed in the heat treatment plate 2 as shown in FIG. 1B. The wafer 1 is then held on the heat treatment plate 2. When the heat treatment is completed, gas is ejected through the holes 4 and simultaneously the air cylinder 8 is driven to raise the push up pin 7 upward. The wafer 1 is then raised above the heat treatment plate 2. Thereafter, the carrying belt 3 is raised to a position enabling carrying of the wafer 1 and the belt receives the wafer 1 from the push up pin 7 to carry the same to a succeeding process.

However, since the above mentioned conventional apparatus for feeding wafers is provided with a belt guiding trench for receiving the wafer carrying belt on the upper surface of the heat treatment plate, it has various disadvantages. One of the disadvantages is that the temperature distribution of the wafer is not uniform. Another disadvantage is that dust collects on the trench and the dust may possibly adhere to the wafer via the wafer carrying belt. A further disadvantage is that the heat degrades the carrying belt shortening its life, since the temperature of the carrying belt varies greatly as it travels in and out of the trench.

SUMMARY OF THE INVENTION

Therefore, a main object of the present invention is to provide an apparatus for carrying wafers in which the temperature distribution of the wafer is not influenced by the carrying apparatus.

Another object of the present invention is to provide an apparatus for carrying wafers in which dust gathered on the heat treatment is not transferred to the wafer by the wafer carrying belt.

A further object of the present invention is to provide an apparatus for carrying wafers in which the carrying belt is not subjected to adverse heat cycles.

The above described objects of the present invention are attained by omitting forming of a trench on the heat treatment plate and by carrying the wafer onto and from the heat treatment plate using a device other than a carrying belt.

Briefly stated, the apparatus for carrying wafers according to the present invention comprises a through-hole in the heat treatment plate that is used for heat treating wafers and wafer elevating means which protrude from and are retractable into the heat treatment plate through the through-hole wherein the wafer is carried into and out from the heat treatment plate by the wafer elevating means.

The apparatus for carrying wafers according to the present invention requires no trench on the heat treatment plate and the wafers can be carried into and out from the heat treatment plate without a carrying belt.

According to a preferred embodiment of the present invention, the apparatus for carrying wafers comprises a heat treatment plate having a through-hole, wafer elevating means having a wafer placing portion and which protrudes from and is retractable into the surface of the heat treatment plate through the through-hole and wafer holding means for carrying the wafer into and out from the wafer elevating means.

By structuring the apparatus for carrying wafers as described above, the wafers are carried onto and out from the heat treatment plate steadily and the disadvantages of the prior art can be eliminated.

According to a more preferred embodiment of the present invention, the wafer elevating means comprises a plurality of pins the tip ends of which forms a placing portion for stably holding the wafer, the wafer holding means comprises a pair of elongated members arranged in parallel and the spacing thereof can be changed. The spacing is narrower than the width of the wafer before the wafer is handed over to the wafer elevating means and the spacing is wider than the width of the wafer after the wafer is handed over the wafer elevating means. The width is wider than that of the wafer before receiving the wafer from the wafer elevating means and it becomes narrower than the width of the wafer after receiving same.

By structuring the apparatus for carrying wafers as described above, the wafer elevating means carries the wafer steadily onto and off the heat treatment plate. In addition, the wafers are easily transferred between the wafer elevating means and the wafer holding means.

According to another preferred embodiment of the present invention, a pair of elongated members arranged in parallel, which constitute the substrate holding means, is movable in the longitudinal direction of the elongated member for carrying a wafer on which the heat treatment will be carried out from the postion of its reception from the carrying apparatus in the preceding step onto the heat treatment plate and for carrying the wafer on which the heat treatment was carried out from the heat treatment plate to a position for handing it over to the carrying apparatus of the succeeding step.

By structuring the wafer holding means as described above, wafers can be easily carried from the carrying apparatus of a process step onto the heat treatment plate as well as from the heat treatment plate to the carrying apparatus of a succeeding process step.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are described below with reference to the figures.

Figure 1A:
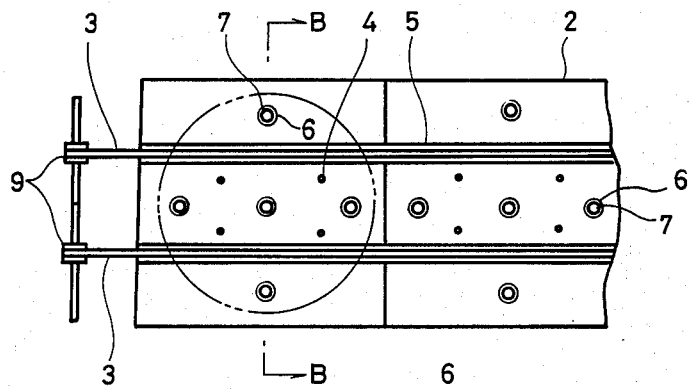
FIG. 1A is a plan view of a conventional wafer carrying apparatus.
Figure 1B:
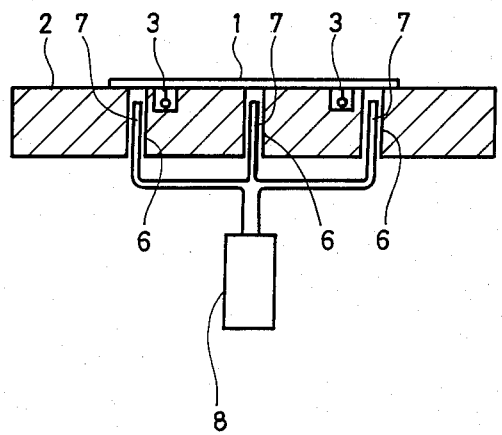
FIG. 1B is a cross sectional view taken along line B—B in FIG. 1A.
Figure 2:
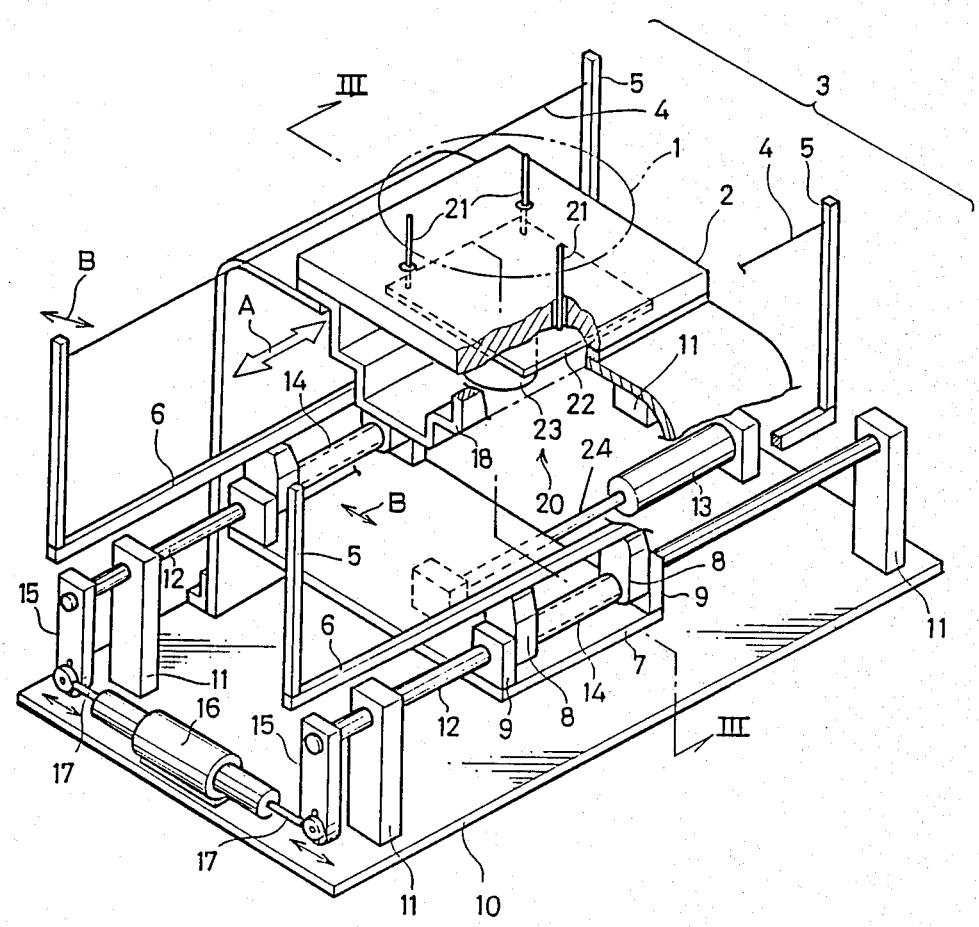
FIG. 2 is a perspective view of the wafer carrying apparatus according to the present invention.
Figure 3:
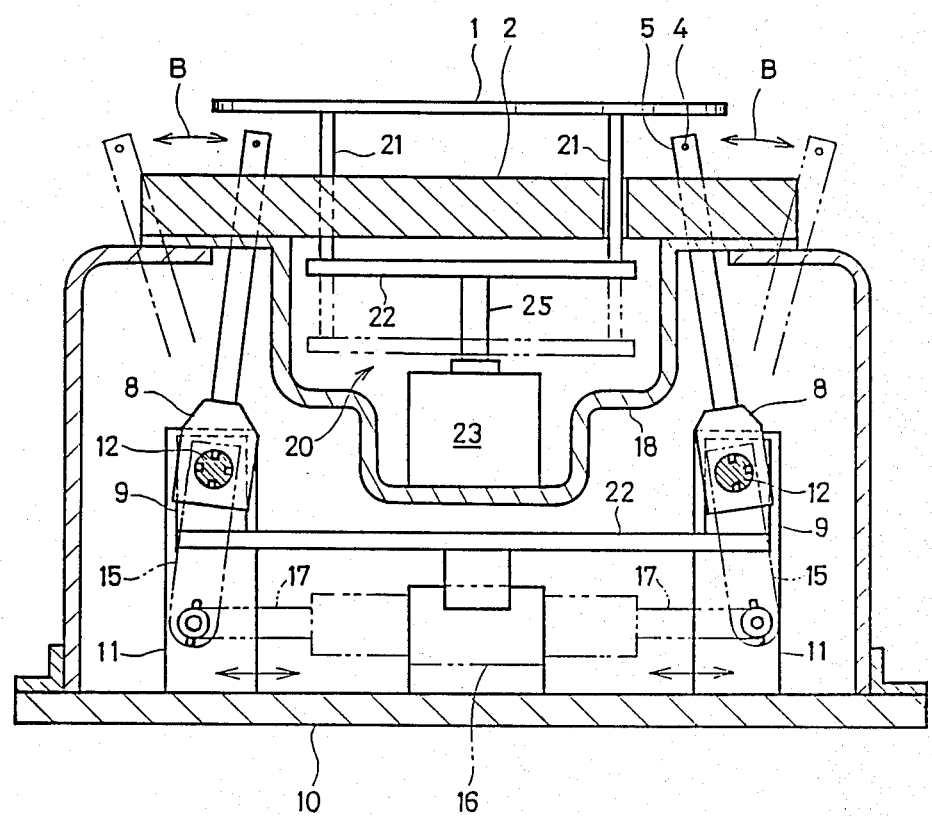
FIG. 3 is a cross sectional view taken along the line III—III of FIG. 2.

FIG. 2 is a perspective view showing the wafer carrying apparatus of the heat treatment apparatus according to the present invention and FIG. 3 is a cross sectional view taken along the line III—III of FIG. 2.

The wafer carrying apparatus comprises a heat treatment plate 2 having through-holes, wafer holding means 3 including a pair of wires 4 for placing the wafer 1 thereon and wafer elevating means 20 having wafer supporting pins 21. The above described wafer holding means 3 supports wafer 1 for being carried onto the heat treatment plate 2 and to carry a wafer 1, which has been subjected to the heat treatment from the heat treatment plate 2, off. The above described wafer supporting pins 21 penetrate and protrude from the upper surface of heat treatment plate 2 and are retracted below the upper surface.

The wafer holding means 3 comprises a front pair and rear pair of support arms 5 with wires 4 and 4 extending between each pair of arms 5. The pairs form a wafer placing member that lie parallel to each other. An arm space switching twin actuator 16 is effective for widening and narrowing the parallel spacing between the wafer carrying wires 4 and 4 by pivotally moving the support arms 5 respectively into the direction of the arrow B. An arm supporting base 7 is movable reciprocatingly in the horizontal direction (the direction of the arrow A) for supporting support arms 5 pivotally. An actuator 13 constitutes a carry driving means for reciprocatively driving the arm support base 7.

Each set of the support amrs 5 and 5 has a wire 4 stretched between the tip ends thereof and the lower ends of each pair of the arms are fixed at opposite ends of a support bar 6. The support bar 6 is swingably supported in the arm support base 7 around a spline cylinder 14, which will be described below, via a set of swingable support members 8 and 8 and pivotal support members 9 and 9.

The arm support base 7 is suspended on two parallel spline shafts 12 and 12, supported respectively on a a front and a rear pair shaft holder 11, each of which rests, on the base 10. The base 7, is structured such that it reciprocates in the left and right direction (arrow A) by means of the carry driving actuator 13.

Each set of the swingable support members 8 and 8 of arm support base 7 is coupled to the spline shaft 12 via a spline cylinder 14 in such a manner that it can swing and move in left and right direction. On the other hand, swingable arms 15 and 15 provided on one end of the spline shafts 12 and 12 are coupled to the outlet rods 17 and 17 of the twin actuator 16. By the operation of the twin actuator 16, the parallel spacing of the wafer carrying wires 4 and 4 is switched between two states, that is, wide and narrow.

The wafer elevating means 20 comprises three wafer support pins 21 so oriented that their tip ends penetrate the heat treatment plate 2 and protrude from and are retractable into the upper surface of the plate, a pin elevating plate 22 below the heat treatment plate 2 supports the wafer support pins 21 and an elevating actuator 23 shown in FIG. 3 serves for elevationally driving the pin elevating plate 22. The wafer 1 is supported between the upper surface of the heat treatment plate 2 and the carrying wire 4 via the support pin 21. The elevating actuator 23 is fixed to a fixed support frame 18 of heat treatment plate 2. When the wafer is undergoing heat treatment, the wafer support pins 21 are disposed below the heat treatment plate in order to avoid the influence of the heat.

The operation of the above described wafer holding means is as follows.

The wafer 1 is placed on the heat treatment plate 2 in the following manner.

First, the rod 17 of the twin actuator 16 is extended to narrow the parallel space between the carrying wires 4 and 4. Thereafter a wafer 1 is placed on the wires 4 and 4 by means of a supply side wafer carrying means (not shown). In that state, the rod 24 of the carry driving actuator 13 is extended and the arm support base 7 is moved forward to carry the wafer 1 onto the heat treatment plate 2. Subsequently, the rod 25 of the elevating actuator 23 is activated to raise the wafer support pins so as to receive the wafer 1 on the support pins 21. In this state, the rod 17 of the twin actuator 16 is contracted to widen the parallel space between the carrying wires 4 and 4 in order not to obstruct the way of the wafer 1 on its way down onto the upper surface of the heat treatment plate 2. The rod 25 of the elevating actuator 23 is again retracted so as to place the wafer 1 on the upper surface of the heat treatment plate 2. Thereafter, the rod 24 of the carry driving actuator 13 is contracted and the carrying wires 4 and 4 are returned to the original position. In the heat treatment, the wafer 1 is preferably adhered to the heat treatment plate so that the wafer makes close contact with the heat treatment plate 2.

The wafer 1 having gone through the heat treatment process such as heating or cooling is carried out from the heat treatment plate 2 in the following manner.

First, the rod 25 of the elevating actuator 23 is extended to raise the wafer support pin 21 to lift up the wafer. Thereafter the rod 17 of the twin actuator 16 is extended to narrow the parallel space between the carrying wires 4 and 4. The rod 25 of the elevating actuator 23 is again contracted to lower the wafer support pin, so that the wafer 1 is handed over the carrying wires 4 and 4. Subsequently the rod 24 of the carrying actuator 13 is extended and the arm support base 7 is moved backward, whereby the wafer 1 is carried out from above the heat treatment plate 2 to the right direction of the arrow A. Thereafter the wafer 1 is handed to the succeeding step by delivery side wafer carrying means (not shown). After the wafer 1 is handed to the succeeding step, the rod 24 of the carrying actuator 13 is contracted to move the arm support base backward to the original position to receive the next wafer. The heat treatment of the wafers is carried out continuously by the repetition of the above described operations.

The present invention is not limited to the above described embodiment and the substrate holding means may comprise a bar member other than wires 4 and 4, the arm spacing switching means may comprise swingable drive means other than the twin actuator 16 and so on.

In the wafer carrying apparatus according to the present invention, the carrying of the wafer and the placing of the wafer onto the heat treatment plate, which were carried out by one carrying belt in the prior art, are carried out using respective independent means. Means for placing the wafer on the heat treatment plate comprises a wafer elevating means which is capable of protruding from and retracting into the heat treatment plate through through-holes provided in the heat treatment plate. Therefore, there is no need to form a guide trench on the upper surface of the heat treatment plate for receiving a wafer carrying member such as the carrying belt. Therefore, the wafer has uniform temperature distribution, because it is free from the influence caused by the existence of the guiding trench. Since there is no dust gathered in the guiding trench, dust will not stick to the wafer through contamination from a wafer carrying member. Furthermore, the wafer holding member such as the carrying belt will have a long life since it is not degraded by heat in the guiding trench.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer processing apparatus, comprising:
   a heat treatment plate having a main surface, said apparatus being effective for carrying a wafer onto and off said main surface of said heat treatment plate for effecting a heat treatment of said wafer, said main surface having a plurality of spaced through-holes passing therethrough, but otherwise, said main surface thereof being flat and contiguous;
   wafer elevating means having a placing portion for supporting said wafer thereon, said wafer elevating means being mounted to selectively protrude above said main surface and retract into said main surface of said heat treatment plate through said plurality of through-holes, said wafer elevating means comprising a plurality of pins movable up and down through said through-holes and having pin tip ends maintained at the same height, said pin tip ends of said plurality of pins forming said placing portion;
   said wafer elevating means being effective to selectively lift said wafer above the main surface of said heat treatment plate and to selectively place said wafer on said main surface of said heat treatment plate upon retraction of said wafer elevating means below said heat treatment plate; and
   wafer holding means for selectively holding said wafer and for transferring and retrieving said wafer to and from said wafer elevating means, said wafer holding means comprising support arm means and a pair of spaced elongated members extending at opposite sides of and above said heat treatment plate and mounted to and stationarily relative to said support arm means, and means for moving said support arm means.

2. An apparatus according to claim 1, including means for positioning said plurality of pins out of and below said through-holes of said heat treatment plate when said wafer undergoes the heat treatment.

3. An apparatus according to claim 1, wherein said plurality of pins include three pins.

4. An apparatus according to claim 1, wherein said wafer holding means is effective for being positioned in a manner which does not obstruct vertical movement of said wafer elevating means.

5. An apparatus according to claim 4, wherein the space between said pair of elongated members is changeable and including spacing control means for controlling the spacing between said elongated members.

6. An apparatus according to claim 5, wherein said pair of elongated members comprise a pair of spaced, horizontally disposed, bar portions for placing said wafer thereon and wherein said support arm means comprises a respective pair of generally vertically oriented supporting members for each said bar portions for supporting same.

7. An apparatus according to claim 6, wherein said spacing control means controls the spacing between said bar portions.

8. An apparatus according to claim 5, wherein said moving means is effective for moving said elongated members forward and backward along a predefined path.

9. An apparatus according to claim 7, wherein said moving means is effective for moving said two pairs of supporting members forward and backward along a predefined path.

10. An apparatus according to claim 5, said spacing control means being effective to separate said elongate members by a first spacing which is larger than a diameter associated with said wafer and a second spacing which is smaller than said diameter of said wafer to enable selective placement of said wafer on said elongate members or the passage of said wafer between said elongate members.

11. An apparatus according to claim 10, wherein said moving means is effective for moving said elongated members forward and backward along a predetermined path.

12. An apparatus according to claim 10, said second spacing being effective for transporting said wafer to and from said wafer elevating means and said first spacing being effective for transferring said wafer to said wafer elevating means.

13. An apparatus according to claim 6, said moving means including pivoting means for pivoting said supporting members.

14. An apparatus according to claim 13, wherein said supporting members are pivotable away from and toward one another.

15. An apparatus according to claim 14, wherein said bar portions are comprised of a respective wire extending between each said respective pair of supporting members.

16. An apparatus according to claim 13, said pivoting means comprising a piston.

17. A method for placing a wafer onto and removing the wafer from a main surface of a heat treatment plate for a heat treatment thereof, said heat treatment plate having a plurality of through-holes passing therethrough and being otherwise flat and contiguous, said method comprising the steps of:

providing a wafer elevating device capable of passing through said plurality of through-holes and projecting above said main surface;

providing a wafer holding device having wafer supporting and horizontally extending elongated members that may be spaced apart at a first and second spacing, the first spacing being larger than said wafer and permitting said wafer to pass between said elongated members and the second spacing being narrower than said wafer, the elongated members being mounted on and stationarily relative to support arm means;

setting said wafer holding device to said second spacing;

placing said wafer on said wafer holding device;

moving said wafer holding device to a location which places said wafer disposed on said wafer holding device above said heat treatment plate;

moving said wafer elevating device through said through-holes and engaging and supporting said wafer;

setting said wafer holding device to said first spacing; and retracting said wafer elevating device through said plurality of through-holes in a manner that enables said wafer to pass between said elongated members and to come to rest atop said main surface of said heat treatment plate.

18. A method according to claim 17, further comprising the steps of:

subjecting said wafer to heat treatment at said heat treatment plate;

raising said wafer by means of said wafer elevating device above said main surface;

setting said wafer holding device to said second spacing; and retracting said wafer elevating device through said plurality of through-holes of said heat treatment plate, whereby said wafer becomes supported on said wafer holding device.

19. A method according to claim 18, further comprising the step of moving said wafer holding device in a prescribed direction which is effective for moving said wafer away from said heat treatment plate.

* * * * *